United States Patent
Orlowski et al.

(10) Patent No.: US 7,221,006 B2
(45) Date of Patent: May 22, 2007

(54) GESOI TRANSISTOR WITH LOW JUNCTION CURRENT AND LOW JUNCTION CAPACITANCE AND METHOD FOR MAKING THE SAME

(75) Inventors: Marius Orlowski, Austin, TX (US); Sinan Goktepeli, Austin, TX (US); Chun-Li Liu, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/110,234

(22) Filed: Apr. 20, 2005

(65) Prior Publication Data

US 2006/0237746 A1    Oct. 26, 2006

(51) Int. Cl.
*H01L 31/00* (2006.01)
(52) U.S. Cl. .............. 257/192; 257/19; 257/347; 257/374; 257/410; 257/92; 257/344
(58) Field of Classification Search .............. None
See application file for complete search history.

(56) References Cited

U.S. PATENT DOCUMENTS

| | | | |
|---|---|---|---|
| 6,621,131 B2 | 9/2003 | Murthy et al. | |
| 2005/0093084 A1* | 5/2005 | Wang et al. | 257/410 |
| 2005/0224897 A1* | 10/2005 | Chen et al. | 257/410 |
| 2005/0282353 A1* | 12/2005 | Wise et al. | 438/435 |
| 2006/0205167 A1* | 9/2006 | Kavalieros et al. | 438/300 |

OTHER PUBLICATIONS

Dalal and Herrold, "Microcrystalline Germanium Carbide: a New, Almost Direct GAP, Thin Film Material For Photovoltaic Energy Conversion"; Mat. Res. Soc. Symp. Proc., vol. 664; 2001, pp. A25.12.1 through A25.12.5.
H. Shang; "Electrical Characterization of Germanium p-Channel MOSFETs"; IEEE Electron Device Letters; vol. 24, No. 4, Apr. 2003; pp. 242-244.
Huiling Shang; "Self-Aligned n-Channel Germanium MOSFETs With a Thin Ge Oxynitride Gate Dielectric and Tungsten Gate"; IEEE Electron Device Letters; vol. 25, No. 3, Mar. 2004; pp. 135-137.
Dalal and Herrold; "Microcrystalling Germanium Carbide-A New Material for PV Conversion"; Iowa St. University, Dept of Elec and Comp Engr; pp. 348-349.
Meuris, M. et al.; "Germanium Deep-Sub Micron PMOS Transistors With Etched Tan Metal Gate on a High-K Dielectric, Fabricated in a 200MM Prototyping Line"; IMEC, Kapeldreef 75, B-3001 Leuven, Belgium; Lam Research Corp., Fremont, CA 94538, USA, Umicore, B-2250 Olen, Belgium; and KU Leuven, Kasteelpark Arenberg 10, B-3001 Leuven, Belgium; Electrochemical Society Proceedings; vol. 2004-07; pp. 693-700.

* cited by examiner

*Primary Examiner*—Evan Pert
*Assistant Examiner*—Fazli Erdem
(74) *Attorney, Agent, or Firm*—John A. Fortkort; Fortkort & Houston P.C.

(57) ABSTRACT

A semiconductor device (101) is provided herein which comprises a substrate (103) comprising germanium. The substrate has source (107) and drain (109) regions defined therein. A barrier layer (111) comprising a first material that has a higher bandgap ($E_g$) than germanium is disposed at the boundary of at least one of said source and drain regions. At least one of the source and drain regions comprises germanium.

19 Claims, 4 Drawing Sheets

GESOI TRANSISTOR WITH LOW JUNCTION CURRENT AND LOW JUNCTION CAPACITANCE AND METHOD FOR MAKING THE SAME

FIELD OF THE DISCLOSURE

The present disclosure relates generally to semiconductor devices, and more particularly to source/drain constructions and methods for making the same.

BACKGROUND OF THE DISCLOSURE

Germanium bulk devices and GeOI ("Germanium-On-Insulator") devices have received much interest in the art as possible replacements for their silicon analogs in some applications, due to the higher electron and hole mobilities in germanium as compared to silicon. For example, it has been shown that germanium-based transistors can exhibit a 400% greater hole mobility, and a 250% greater electron mobility, than silicon-based transistors. This higher mobility offers potential improvements in drive currents that are some 300% greater than the drive currents in comparable silicon devices. In theory, then, it should be possible to make transistors with bulk germanium or GeOI substrates that are much faster than those currently made from bulk silicon or SOI ("Silicon-On-Insulator") substrates. These faster transistors would enable a variety of technologies, such as the high-speed photodetectors, that are likely to be critical components in future on-chip optical interconnects.

Unfortunately, due to the low energy band gap ($E_g$=0.66 eV) of germanium, germanium-based transistors suffer from excessive diode leakage currents. In addition, due to the high dielectric constant of germanium ($\epsilon$(Ge)=16), the junction capacitance ($C_j$) of these devices is high. Consequently, in practice, it is found that the drive current improvements in transistors made from bulk germanium or GeOI substrates is often compromised by high leakage currents and higher junction capacitance than is found in their silicon counterparts. This issue has precluded the use of these devices in high performance and low power applications.

There is thus a need in the art for a method for overcoming the aforementioned limitations. In particular, there is a need in the art for a method for making transistors from bulk germanium or GeOI substrates that exhibit reduced leakage currents and lower junction capacitance, and for devices made in accordance with this method. These and other needs are met by the devices and methodologies described herein.

SUMMARY OF THE DISCLOSURE

In one aspect, a semiconductor device is provided herein which comprises (a) a substrate comprising germanium, said substrate having source and drain regions defined therein; (b) a barrier layer disposed at the boundary of at least one of said source and drain regions, said barrier layer comprising a first material that has a higher bandgap ($E_g$) than germanium; and (c) a source or drain region containing a second material that comprises germanium. The first material is preferably selected from the group consisting of Si, SiGeC, GeC and SiC, and the second material is preferably selected from the group consisting of Ge, SiGe, and SiGeC. The substrate may be a bulk Ge substrate or a GeOI substrate.

In another aspect, a method for making a source or drain region in a transistor is provided. In accordance with the method, a substrate is provided which comprises germanium. A recess is formed in the substrate, and a barrier layer is formed in the recess, the barrier layer comprising a first material that has a higher bandgap ($E_g$) than germanium. The recess is filled with a second material comprising germanium.

In another aspect, a method for making a transistor is provided herein. In accordance with the method, a substrate is provided which comprises germanium. A gate region is defined on the substrate, and a portion of the substrate is removed on each side of the gate region, thereby defining source and drain recess regions. A barrier layer is formed in at least one of the source and drain recess regions, the barrier layer comprising a first material that has a higher bandgap ($E_g$) than germanium. The source and drain recess regions are then filled with a second material comprising germanium.

In a further aspect, a method for making a transistor is provided herein. In accordance with the method, a substrate is provided which is selected from the group consisting of bulk germanium substrates and GeOI substrates. A gate region is formed on the substrate, and first and second recesses are etched in the substrate. A barrier layer is formed in the first and second regions, the barrier layer comprising a first material selected from the group consisting of Si, SiGeC, GeC and SiC. The first and second regions are filled with a second material selected from the group consisting of Ge, SiGe, and SiGeC. The transistor has source and drain regions in the first and second regions, respectively.

These and other aspects of the present disclosure are described in greater detail below.

DETAILED DESCRIPTION

It has now been found that germanium-based semiconductor devices may be made that exhibit reduced leakage currents and lower junction capacitances. These devices may be achieved through the provision of a barrier layer (preferably a thin epitaxial layer) that comprises a material that has a higher bandgap ($E_g$) (and preferably a lower dielectric constant) than germanium, and that is disposed between the source and/or drain regions of the device and the substrate. The use of such a barrier layer, which may comprise a semiconductor material such as Si, SiGe, GeC, SiGeC, or SiC, can reduce leakage current and lower junction capacitance ($C_j$) if implemented appropriately. For example, the band gap of GeC with only 2% C is 1.1 eV, which is almost equal to the band gap of silicon, and the dielectric constant of GeC is below 11, and hence lower than the dielectric constant of germanium.

The placement of the barrier layer can be achieved in a variety of ways. Preferably, however, it is accomplished by etching a recess on the drain side and/or source side, lining or filling part of the recess with a thin layer of a material such as Si, SiGe, GeC, SiGeC, or SiC (all of which are semiconductor materials with higher band gaps and lower dielectric constants than germanium), and then back-filling the source/drain recesses with epitaxially grown germanium or SiGe. The source/drain regions may be appropriately in-situ doped with Ga, B, P or As.

The methodology described herein can be applied to both bulk germanium and GeOI (Germanium On Insulator) devices, and can be applied symmetrically or asymmetrically to source/drain regions. This methodology makes GeOI substrates very attractive for high performance and low power applications, because it combines very high carrier mobilities with low leakage currents and the lower junction capacitance characteristic of SOI. The resulting devices are suitable for use in all high performance, low power applications, including those of 65, 45, 32 and 22 nm technology nodes, and can be used for both single gated and double gated transistors. The methodology described herein may also be applied to both planar and non-planar devices. Thus, for example, the methodologies described herein may be applied to the fabrication of FinFET devices.

Figure 1:
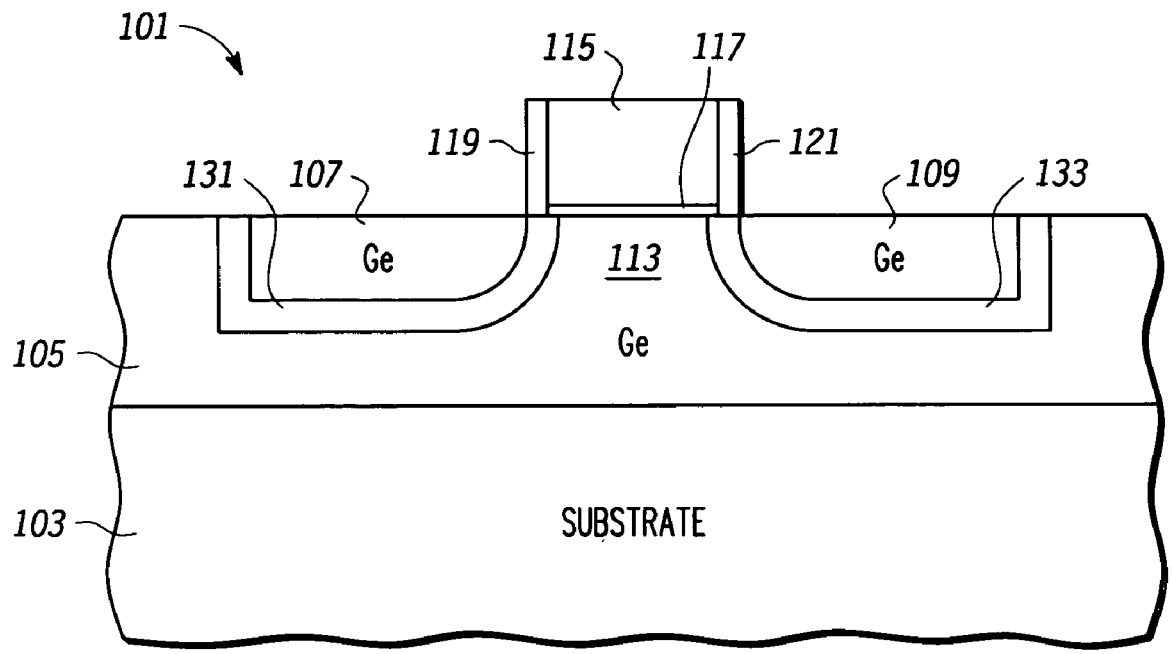
FIG. 1 is an illustration of a first embodiment of a semiconductor device made in accordance with the teachings herein.
Figure 2:
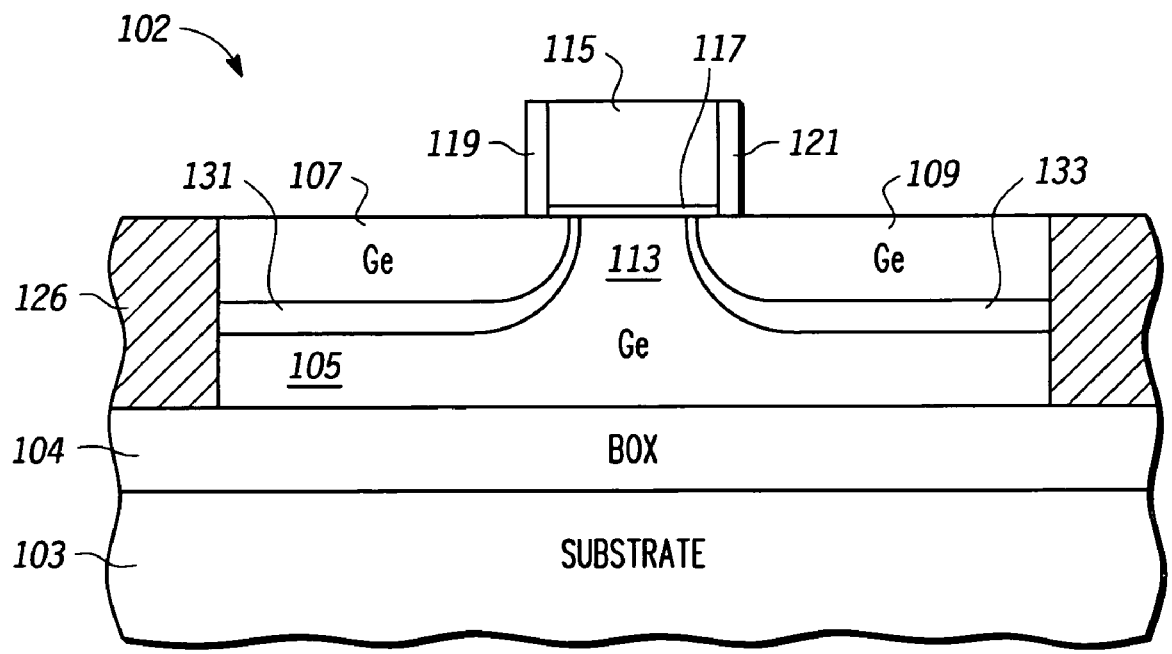
FIG. 2 is an illustration of a second embodiment of a semiconductor device made in accordance with the teachings herein.

FIGS. 1-2 illustrate two possible, non-limiting embodiments of a transistor made in accordance with the teachings herein. With reference to FIG. 1, the transistor 101 depicted therein comprises a substrate 103 having a germanium layer 105 disposed thereon. The particular substrate depicted is a bulk substrate, though various other substrates may be used, including, for example, GeOI wafers. The germanium layer 105 is preferably epitaxially grown on the substrate, and hence replicates the crystalline structure of the substrate. Therefore, germanium layer 105 will usually have a single crystal morphology.

Source 107 and drain 109 regions are defined in the structure, and are separated from the underlying germanium layer 105 by barrier layers 131 and 133, respectively. The source 107 and drain 109 regions may comprise the same or different materials, and preferably comprise Ge, SiGe or SiGeC. The source 107 and drain 109 regions may be doped with gallium, indium or boron for PMOS applications, and may be doped with P or As for NMOS applications. The doping may be performed in situ or as part of the deposition process that is preferably used to form the source 107 and drain 109 regions.

The barrier layers 131 and 133 may comprise the same or different materials, and may be formed in the same or in different processing steps. They are preferably epitaxially grown, and may comprise SiGeC, GeC, SiC, Si, SiGe, or the like. Preferably, the barrier layers 131 and 133 have a thickness within the range of 20 to 110 Å, more preferably in the range of 30 to 70 Å, and most preferably within the range of 40 to 60 Å.

A gate electrode 115 is disposed over the channel region 113 of the device and is separated therefrom by a gate dielectric 117. In the particular embodiment depicted, the gate electrode is further provided with spacer structures 119, 121. Although the spacer structures 119, 121 are depicted as being symmetrical, in some embodiments, they may be asymmetrical in their dimensions and/or in their disposition about the gate electrode 115.

The transistor 102 depicted in FIG. 2 differs from the transistor 101 depicted in FIG. 1 in some notable respects. In the transistor 101 of FIG. 1, the source 107 and drain 109 regions are bounded by the barrier layers 131 and 133 on all sides, while in the transistor 102 of FIG. 2, the source 107 and drain 109 regions are bounded on one side by a field isolation region 126 (which may be, for example, a shallow trench isolation (STI) structure), and are bounded by their respective barrier layers 131 and 133 elsewhere. The field isolation regions 126 may be used to isolate wells of different conductivity types, and to isolate adjacent transistors. Moreover, in the transistor 102 depicted in FIG. 2, the gate electrode 115 and the gate dielectric 117 extend over the source 107 and drain 109 regions.

Figure 3:
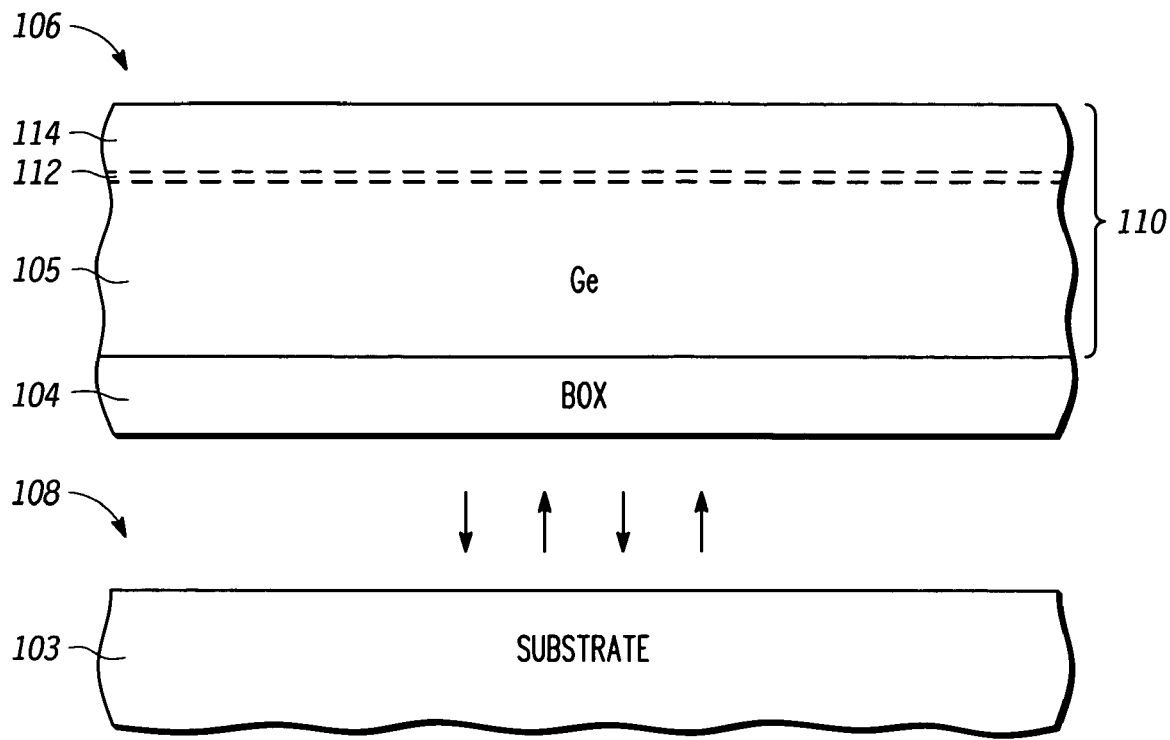
FIG. 3 is an illustration of a method for making an SOI wafer.
Figure 4:
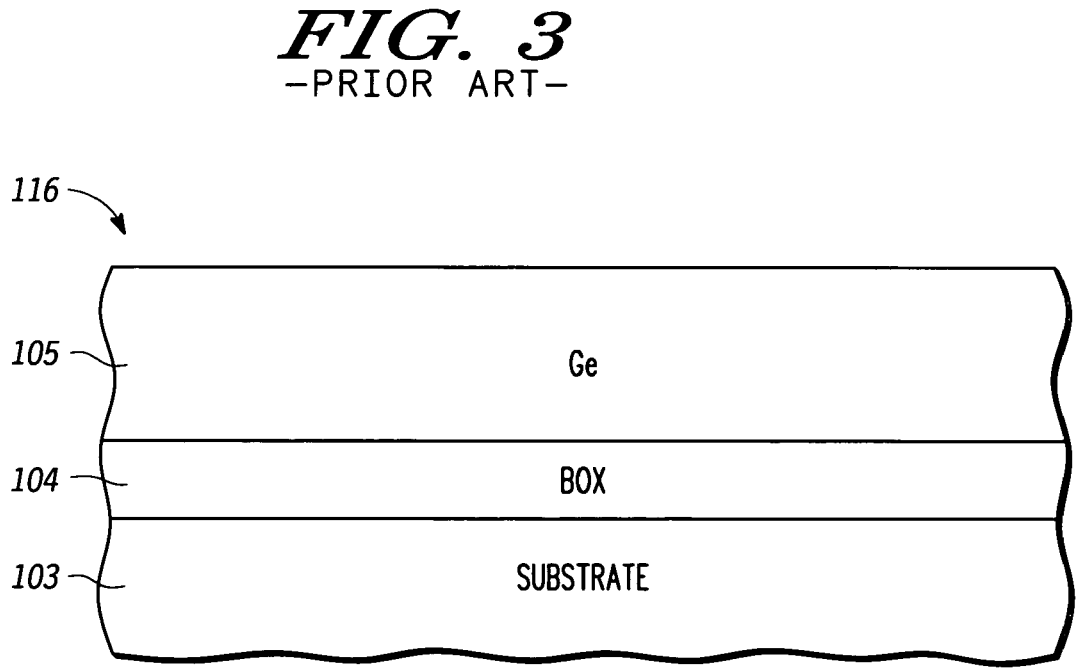
FIG. 4 is an illustration of a method for making an SOI wafer.

The transistor 102 depicted in FIG. 2 also differs from the transistor 101 depicted in FIG. 1 in that it is formed on an SOI (Semiconductor On Insulator) substrate. In the particular embodiment depicted, this substrate contains a layer of buried oxide (BOX) 104, though it will be appreciated that other electrically insulating materials could be used as well. FIGS. 3-4 illustrate the formation of such a substrate from a handle wafer 106 and a donor wafer 108 by a hydrogen ion delamination method. In accordance with that method, a handle wafer 106 is provided which comprises an oxide layer 104 and a first semiconductor layer 110, and which has a micro bubble layer 112 formed in the first semiconductor layer 110 by gas ion implantation. A donor wafer 108 is provided which comprises a second semiconductor layer 103. The microbubble layer 112 divides the first semiconductor layer 110 into a first portion 105 adjacent to the oxide layer 104 and a second portion 114 removed from the oxide layer. The handle wafer 106 is then bonded to the second semiconductor layer 103 of the donor wafer 108 by way of the oxide layer 104, followed by delamination of the second portion 114 of the first semiconductor layer 110 along the plane of the micro bubble layer 112.

In the resulting wafer 116 shown in FIG. 4, the oxide layer 104 (now a BOX layer) is sandwiched between the second semiconductor layer 103 and the first portion 105 of the first semiconductor layer 110. Hence, the resulting wafer is an SOI wafer (it should be noted that a similar approach could be utilized to form a GeOI wafer). The two semiconductor layers 103, 105 may comprise the same or different materials, and may have the same or different crystalline lattice structures. For example, either semiconductor layer may have either a <110> lattice structure or a <100> lattice structure. Moreover, the handle wafer 106 and the donor wafer 108 may each have additional layers beyond those illustrated. The SOI wafer may also be subjected to various heat treatment steps prior to or during the various processing steps described herein.

The semiconductor devices 101 and 102 depicted in FIGS. 1 and 2 have several advantages over comparable devices known to the art. For example, as previously noted, germanium has a much lower energy band gap than silicon (Eg=0.66 eV as compared to Eg=1.11 eV). Consequently, Ge-based transistors suffer from diode leakage currents that are several orders of magnitude higher than their silicon counterparts. In addition, due to the high dielectric constant of Ge (ε(Ge)=16), the junction capacitance ($C_j$) of these devices is high. Consequently, in practice, it is found that the improvements in drive currents in transistors made from bulk Ge or GeOI substrates is often compromised by high leakage currents and higher junction capacitance as compared to their silicon counterparts. This issue has precluded the use of these devices in high performance and low power applications.

By contrast, in the semiconductor devices disclosed herein, the inclusion of a barrier layer of a higher energy band gap material can significantly increase the energy band gap, thus greatly reducing leakage currents. Thus, for example, if the barrier layer is silicon, the silicon will be strained, and hence will have a somewhat lower energy band gap (typically about 0.98 eV) than unstrained silicon. However, the energy band gap of the strained silicon will still be much higher than the energy band gap of germanium. Likewise, various carbon-containing semiconductor compositions (e.g., SiGeC, GeC, and SiC) can be utilized that have even higher band gaps. Thus, the use of GeC with 2% carbon (by weight, based on the total weight of the composition) in the barrier layers 131 and 133 increases the band gap of germanium from 0.66 eV to about 1.1 eV. Since it is possible to epitaxially grow GeC alloys at low temperatures (300° C. to 400° C.) with up to 3% carbon inclusion in the germanium lattice, even higher band gaps may be achievable.

With respect to the semiconductor devices of FIGS. 1-2, it will be noted that the source 107 and drain 109 regions have been defined such that the metallurgical junctions come to lie within their respective barrier layers 131 and 133, where the band gap is 1.1 eV or higher. This may be accomplished, if needed, through appropriate source/drain extensions. This arrangement, coupled with the use of deep source 107 and drain 109 regions, ensures that the diode leakage current will be suppressed to the levels found in silicon-based diodes. The higher band gap energies of the embedded barrier layers 131 and 133 will also greatly attenuate band-to-band tunneling current.

The constructions of FIGS. 1-2 are further advantageous in that the junction capacitance ($C_j$) in this construction is significantly reduced as a result of the reduction in dielectric constant in going from germanium (ε(Ge)=16) to the material of the barrier layers 131 and 133 (for example, (ε(Si) =11.7). Thus, for example, if the barrier layers 131 and 133 comprise silicon, and since Vegard's law will typically be obeyed in these constructions, the dielectric constant for the barrier layers 131 and 133 will typically lie between silicon and germanium. The use of materials such as SiC (ε(SiC) <11) that have even lower dielectric constants can reduce the junction capacitance even further.

In some embodiments of the semiconductor devices described herein, halo regions may be formed on either or both of the source 107 and drain 109 sides of the device to further tune the electrical characteristics of the device. Such a halo may be formed symmetrically or asymmetrically. Preferably, the halo is formed only on one side (preferably the source side) through asymmetrical source/drain epitaxial growth.

Figure 5:
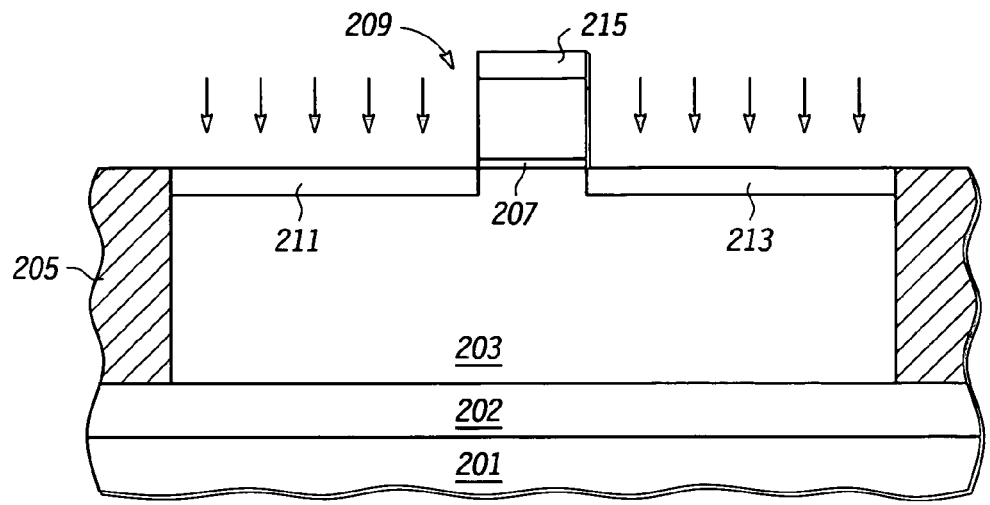
FIG. 5 is an illustration of a processing step in one embodiment of a method for making a semiconductor device in accordance with an the teachings herein.

FIGS. 5-10 illustrate a first non-limiting embodiment of the methodology described herein. In accordance with this embodiment, as shown in FIG. 5, a substrate 201 is provided which has a buried oxide layer 202 thereon and a germanium layer 203 disposed over the buried oxide layer 202. The germanium layer 203 is preferably monocrystalline. In some embodiments, the thickness of the germanium layer 203 may be increased by epitaxial growth after formation of the GeOI wafer. Such a process replicates the crystalline morphology of the existing germanium layer.

For a PMOS construction, the germanium layer 203 preferably includes an n-type dopant, which can be formed by implanting phosphorous and/or arsenic ions to produce an n-well having a typical n-type dopant concentration of approximately $5.0 \times 10^{17}/cm^3$. For an NMOS construction, a suitable dopant such as B or Ga may be used.

A plurality of field isolation regions 205 may optionally be formed in germanium layer 203. The field isolation regions 205 may be used to isolate wells of different conductivity types, and may also be used to isolate adjacent transistors. The field isolation regions 205 may, for example, be shallow trench isolation (STI) regions that may be formed by etching a trench into the germanium layer 203, and then filling the trench with an oxide or other suitable dielectric such as $Si_3N_4$.

A gate dielectric layer 207 is then formed on the surface of germanium layer 203. The gate dielectric layer 207 may comprise, for example, a nitrided oxide layer which will preferably be formed to a thickness of between 5 and 30 Å, and more preferably to a thickness of about 11 Å. The gate dielectric layer may also comprise a metal oxide such as $HfO_2$ or $ZrO_2$.

A gate electrode 209 is formed on the gate dielectric layer 207. The gate electrode 209 has a thickness which is preferably within the range of about 500 to about 3,500 Å. The gate electrode 209 may be formed by blanket deposition of a layer of Si, SiGe or polysilicon, which is then patterned utilizing photolithographic techniques as are known to the art. The gate electrode 209 may comprise various metals as well, including, but not limited to, MoN, TaC, TiN, and TaN. In a preferred embodiment, the gate electrode 209 has a length of approximately 60 nm.

As illustrated in FIG. 5, the structure is subjected to a first implantation step, which in one embodiment uses p-dopant ions (in other embodiments, n-type dopants may be used). Preferably, the p-dopants are ions of indium, gallium or boron or compounds of these elements such as $BF_2$, $B_{18}H_{22}$, $B_{10}H_{14}$. This results in the formation of conductive shallow p-doped implant regions 211 and 213 in the exposed surface of germanium layer 203, and in the formation of a conductive shallow p-doped implant region 215 in the exposed upper surface of the gate electrode 209. In the resulting structure, the regions 211 and 213 are located on opposing sides of the gate electrode 209, and are spaced from one another by the width of the gate electrode 209.

Figure 6:
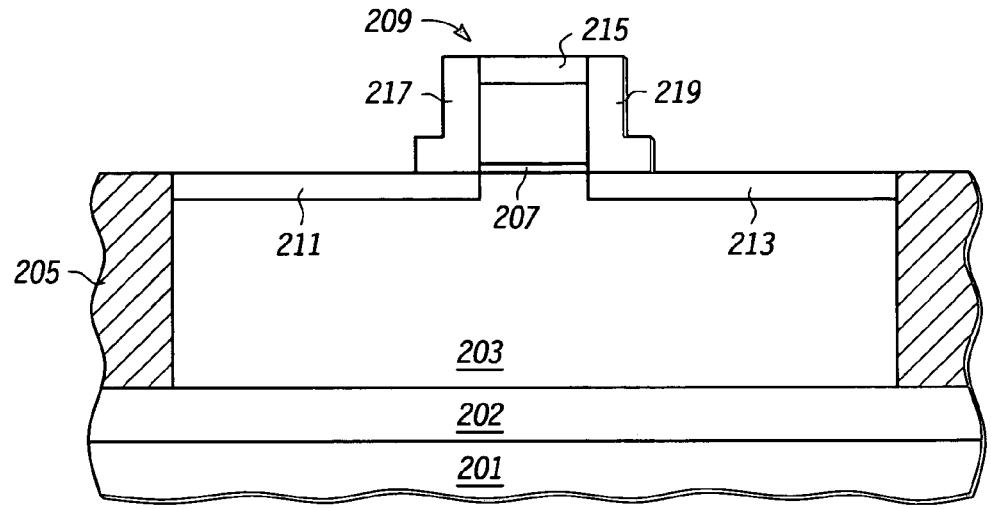
FIG. 6 is an illustration of a processing step in one embodiment of a method for making a semiconductor device in accordance with the teachings herein.

As shown in FIG. 6, spacer structures 217, 219 are then formed on opposing sides of the gate electrode 209. The spacer structures 217, 219 cover the sides of the gate electrode 209, and also cover a portion of the surface of the germanium layer 203 (and more particularly, shallow implant regions 211, 213) adjacent to the gate electrode 209. In the particular embodiment illustrated, the spacer structures 217, 219 are L-shaped. It will be appreciated, however, that the specific geometry and dimensions of the spacers will often be dictated by the particular design, specifications and desired properties of a semiconductor device. For example, in many applications, the use of D-shaped spacer structures is advantageous. The formation of spacer structures is well known in the art, and typically involves deposition of one or more layers of the spacer materials, followed by an etch-back using suitable photolithographic techniques.

Figure 7:
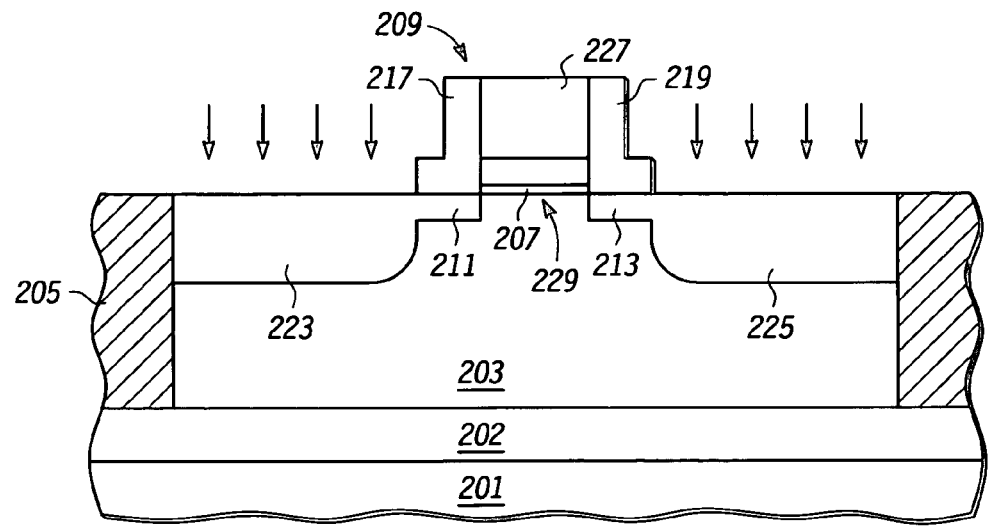
FIG. 7 is an illustration of a processing step in one embodiment of a method for making a semiconductor device in accordance with the teachings herein.

As illustrated in FIG. 7, the upper surfaces of the gate electrode 209 and the surface of the germanium layer 203 are subject to a sacrificial implantation step, which in one embodiment utilizes p-dopant ions (other embodiments may utilize n-type dopants). The dopant material utilized here is preferably the same dopant material (e.g., boron ions) used in the implantation step shown in FIG. 5. The sacrificial implantation step is used to change the etch selectivity of germanium layer 203 for the purposes of defining recesses 231 and 233 that will be subsequently etched into the deep implant regions 223 and 225 (see FIG. 9). The implantation energy of the second implantation step is increased as compared to the implantation energy of the first implantation step depicted in FIG. 5 so that the dopant ions implant deeper into germanium layer 203. The spacer structures 215 and 217 form a mask which prevents implantation of the ions into the portion of the germanium layer 203 underneath the spacer structures 215 and 217. The second implantation step results in the formation of conductive deep p-doped implant regions 223 and 225 in the germanium layer 203, and also results in the formation of a deeper doped region 227 in the gate electrode 209. A shallow channel 229 resulting from the implantation step of FIG. 3 is defined between the inner edges of shallow implant regions 211 and 213.

Figure 8:
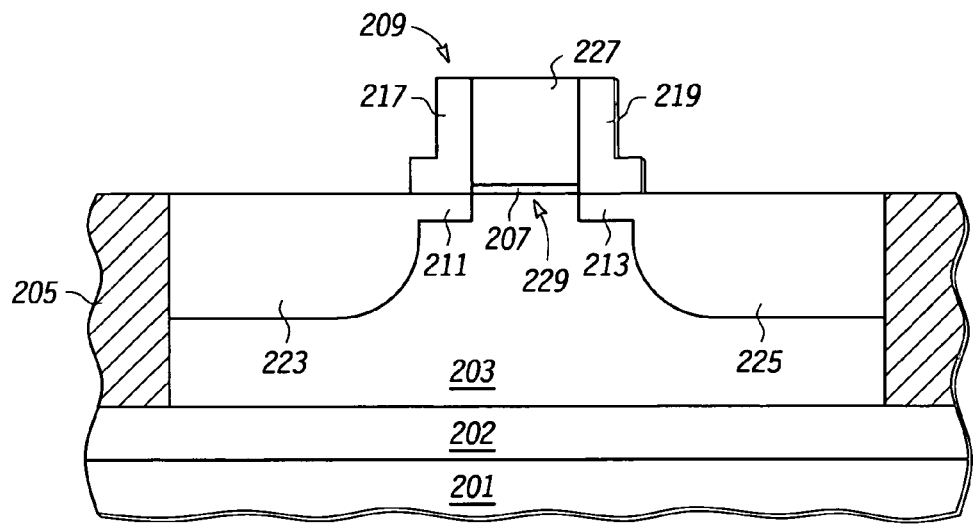
FIG. 8 is an illustration of a processing step in one embodiment of a method for making a semiconductor device in accordance with the teachings herein.

The structure of FIG. 7 is then subjected to an optional annealing process. The attendant heating causes diffusion of the shallow implant regions 211 and 213 and deep implant regions 223 and 225 into germanium layer 203. As shown in FIG. 8, this causes the lower edges of the deep implant regions 223 and 225 migrate further downward into the germanium layer 203.

In some embodiments, the annealing process may also be used to adjust the position of the inner tips of the shallow implant regions 211 and 213 below the gate electrode 209. In one embodiment, the shallow implant regions 211 and 213 comprise epitaxial germanium with a p-dopant concentration of approximately $1\times10^{19}/cm^3$ (the shallow implant regions 211 and 213 are thus doped P−). Preferably, no other materials are present in the shallow implant regions 211 and 213 except germanium and a suitable dopant, the later of which may be selected from the group consisting of arsenic, phosphorous, and boron. The doped region 227 in the gate electrode 209 also diffuses down to the gate dielectric layer 207.

Figure 9:
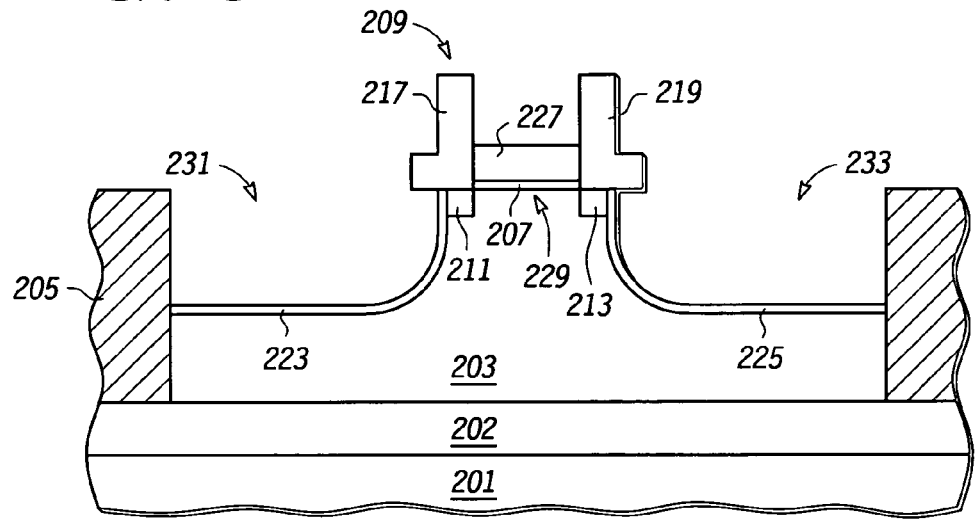
FIG. 9 is an illustration of a processing step in one embodiment of a method for making a semiconductor device in accordance with the teachings herein.

FIG. 9 depicts the structure of FIG. 8 after a selective etch step. An etchant is used which selectively removes that portion of the germanium layer 203 which was doped during the previous sacrificial implant steps over the other exposed materials of the structure of FIG. 8, thus resulting in the formation of recesses 231 and 233 in the deep implant regions 223 and 225. The inner edges of the recesses 231 and 233 are typically aligned somewhere between the inner and outer edges of spacer structures 217 and 219. However, since some lateral undercutting by the subsequently formed source 235 and drain 237 regions (see FIG. 10) is often preferred in the vicinity of the gate dielectric 207, a portion of the shallow implant regions 211 and 213 may be retained in this area. In some applications, a portion of the deep implant region may also be retained. This effect may be achieved, for example, through a combination of isotropic and anisotropic etching.

After the etch, the outer edges of the recesses 231 and 233 are at the field isolation regions 205. It should be noted that the surfaces of recesses 231 and 233 are monocrystalline epitaxial germanium. An upper portion of the gate electrode 209 is also removed during the etching process.

Figure 10:
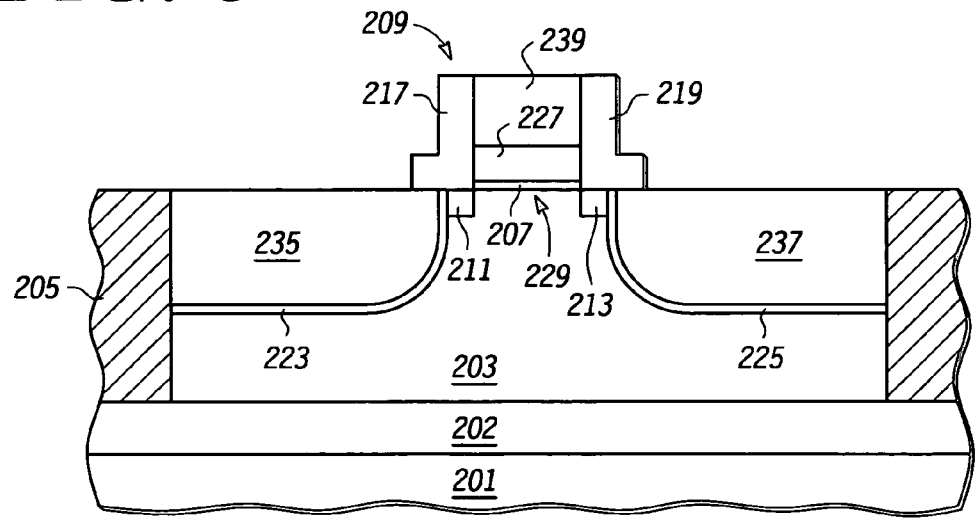
FIG. 10 is an illustration of a processing step in one embodiment of a method for making a semiconductor device in accordance with the teachings herein.

As shown in FIG. 9, barrier layers 222 and 224, which may comprise SiGeC, GeC, SiC, Si, SiGe or other suitable materials, are formed on the exposed surfaces of germanium layer 203, preferably through a suitable epitaxial growth process. Preferably, barrier layers 222 and 224 comprise the same material and are formed simultaneously, though in some applications they may comprise diverse materials and may be formed in separate processing steps. As shown in FIG. 10, source 235 and drain 237 regions are subsequently formed on barrier layers 222 and 224 in the recesses 231 and 233, as by selective epitaxial growth or through another suitable process.

While the source 235 and drain 237 regions are shown in FIG. 10 as being level with the tops of the field isolation regions 205, it will be appreciated that, in some embodiments, the source 235 and drain 237 regions may protrude above the field isolation regions 205, or may be lower than the field isolation regions 205. Moreover, in some embodiments, the source 235 and drain 237 regions may be capped with a layer of SiGe/Si. If an epitaxial growth process is used to form the source 235 and drain 237 regions, this may be accomplished, for example, by switching the process gas from $GeH_4$ to $SiH_4$ at the end of the process.

The source 235 and drain 237 regions preferably comprise SiGe or germanium, which are typically doped with a suitable dopant by ion implantation or another suitable process. For example, in PMOS applications, the germanium may be in situ doped with boron, and the source 235 and drain 237 regions may be formed in a 200 mm chemical vapor deposition chamber at a temperature of 740° C. and charged with dichlorosilane at a flow rate of 20 sccm (standard cubic centimeters per minute), diborane at a flow rate of 70 sccm (and at a 1% concentration), and germane at a flow rate of 50 sccm.

Depending on the choice of materials for the barrier layers 222 and 224 and the source 235 and drain 237 regions, the silicon and the germanium in the source 235 and drain 237 regions can be made to form an alloy having a lattice structure which replicates the lattice structure of the barrier layer 222 but has a larger lattice spacing, at least in a relaxed state. Because of the larger lattice spacing, the source 235 and drain 237 regions create a compressive stress in the shallow channel region 229. The germanium is preferably present in the Si—Ge alloy at a concentration of about 15 atomic percent. It has been found that epitaxy can be maintained with a germanium concentration of up to 20 atomic percent by volume of the Si—Ge alloy.

A further advantage of depositing the source 235 and drain 237 regions is that these regions can contain a relatively large boron concentration. The boron concentration is preferably approximately $5\times10^{20}/cm^3$ (the source 235 and drain 237 regions are thus doped P+). The relatively large concentration of boron creates a relatively low resistance of approximately 0.9 mOhm-cm. A conductive p-doped film 239 also deposits on the previously etched-back gate electrode 209. Suitable results can be obtained with dopant concentrations of $0.5\times10^{20}/cm^3$ or higher. The resistivity is preferably less than 1.1 mOhm-cm.

In the particular embodiment of the process depicted in FIGS. 5-10, germanium layer 203 is single crystal germanium, and the source 235 and drain 237 regions comprise a Si—Ge alloy. However, one skilled in the art will appreciate that it may be possible to create similar structures utilizing other alloys and using additives other than germanium. Moreover, while the specific embodiments disclosed herein have frequently been described with reference to the formation of a PMOS transistor, it will be appreciated that an NMOS transistor may be manufactured in a similar manner, but with the doping conductivity types reversed.

In some embodiments, tensile stress may be created in the channel 229 by utilizing source and drain films of silicon which include carbon. The silicon and carbon form an alloy which has a crystal lattice with the same structure as the lattice structure of the single crystal germanium layer 203, but with a smaller spacing. The source and drain films will thus tend to contract, thereby creating a tensile stress in the channel 229.

A germanium-based semiconductor device has been provided herein which exhibits reduced leakage current and lower junction capacitance than existing germanium-based devices, while maintaining higher mobilities and drive currents. This result has been achieved through the use of a barrier layer comprising a material that has a higher bandgap ($E_g$) and lower dielectric constant $\epsilon$ than germanium.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A semiconductor device, comprising:
    a semiconductor layer comprising germanium and having source and drain regions defined therein; and
    a barrier layer disposed along the bottom of at least one of said source and drain regions, said barrier layer comprising a first material that has a higher bandgap ($E_g$) than germanium;
  wherein at least one of said source and drain regions contains a second material that comprises germanium;
  wherein the bandgap ($E_g$) of said first material is at least about 1.1 eV.

2. The semiconductor device of claim 1, wherein said first material is selected from the group consisting of Si, SiGe, SiGeC, GeC and SiC.

3. The semiconductor device of claim 1, wherein said first material is GeC and contains at least 2% carbon by weight, based on the total weight of the first material.

4. The semiconductor device of claim 1, wherein said second material comprises a material selected from the group consisting of Ge, SiGe, and SiGeC.

5. The semiconductor device of claim 1, wherein said first material has a lower dielectric constant than germanium.

6. The semiconductor device of claim 1, wherein said semiconductor device is a Germanium-On-Insulator (GeOI) substrate.

7. The semiconductor device of claim 1, wherein said barrier layer is formed in both of the source and drain regions.

8. The semiconductor device of claim 1, wherein both of said source and drain regions contain a second material that comprises germanium.

9. The semiconductor device of claim 1, wherein the dielectric constant of said first material is less than about 11.

10. A semiconductor device, comprising:
    a semiconductor layer comprising germanium and having source and drain regions defined therein; and
    a barrier layer disposed at the boundary between at least one of said source and drain regions and said semiconductor layer, said barrier layer comprising a first material that has a higher bandgap ($E_g$) than germanium and a dielectric constant of less than about 11;
  wherein at least one of said source and drain regions contains a second material that comprises germanium.

11. The semiconductor device of claim 10, wherein said first material is selected from the group consisting of Si, SiGe, SiGeC, GeC and SiC.

12. The semiconductor device of claim 10, wherein said first material is GeC and contains at least 2% carbon by weight, based on the total weight of the first material.

13. The semiconductor device of claim 10, wherein said second material comprises a material selected from the group consisting of Ge, SiGe, and SiGeC.

14. A semiconductor device, comprising:
    a semiconductor layer comprising germanium and having source and drain regions defined therein, wherein at least one of said source and drain regions contains a second material that comprises germanium; and
    a barrier layer disposed at the boundary between at least one of said source and drain regions and said semiconductor layer, said barrier layer comprising GeC and containing at least 2% carbon by weight, based on the total weight of the first material.

15. The semiconductor device of claim 14, wherein said first material has a higher bandgap ($E_g$) than germanium.

16. The semiconductor device of claim 14, wherein said second material comprises a material selected from the group consisting of Ge, SiGe, and SiGeC.

17. The semiconductor device of claim 14, wherein said first material has a lower dielectric constant than germanium.

18. The semiconductor device of claim 14, wherein the dielectric constant of said first material is less than about 11.

19. The semiconductor device of claim 14, wherein said barrier layer is disposed at the boundary between each of said source and drain regions.

* * * * *